United States Patent
Nanishi et al.

(10) Patent No.: US 6,593,596 B1
(45) Date of Patent: Jul. 15, 2003

(54) SEMICONDUCTOR LIGHT EMITTING DEVICE AND METHOD FOR ADJUSTING THE LUMINOUS INTENSITY THEREOF

(75) Inventors: Yasushi Nanishi, Otsu (JP); Michio Kadota, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/396,822

(22) Filed: Sep. 14, 1999

(30) Foreign Application Priority Data

Sep. 25, 1998 (JP) .............................. 10-271717

(51) Int. Cl.$^7$ ............................................. H01L 33/00

(52) U.S. Cl. ............................ 257/94; 257/96; 257/97; 257/103; 372/45

(58) Field of Search ........................... 257/94, 96, 97, 257/103; 372/45

(56) References Cited

U.S. PATENT DOCUMENTS

| | | | | |
|---|---|---|---|---|
| 4,082,889 A | * | 4/1978 | DiStefano | 428/328 |
| 5,815,520 A | * | 9/1998 | Furushima | 372/45 |
| 6,045,626 A | * | 4/2000 | Yano et al. | 148/33 |
| 6,046,464 A | * | 4/2000 | Schetzina | 257/96 |
| 6,057,561 A | * | 5/2000 | Kawasaki et al. | 257/94 |

FOREIGN PATENT DOCUMENTS

| | | |
|---|---|---|
| DE | 19629720 | 2/1997 |
| JP | 7263809 | 10/1995 |
| JP | 8139361 | 5/1996 |
| JP | 945960 | 2/1997 |
| JP | 10256673 | 9/1998 |

OTHER PUBLICATIONS

T. Detchprohm, et al., "Hydride Vapor Phase Epitaxial Growth of a High Quality GaN Film Using a ZnO Buffer Layer", Applied Physics Letters, US, American Institute of Physics, New York, vol. 61, No. 22, Nov. 30, 1992, pp. 2688–2690.

T. Ueda, et al.; "Vapor Phase Epitaxy Growth of GaN on Pulsed Laser Deposited ZnO Buffer Layer", Journal of Crystal Growth, NL, North–Holland Publishing Co. Amsterdam, vol. 187, No. 3/04, May 1998, pp. 340–346.

V. Craciun, et al., "Growth of ZnO Thin Films on GaAs by Pulsed Laser Deposition", Thin Solid Films, CH, Elsevier–Sequoia S.A. Lausanne, vol. 259, No. 1, 1995, pp. 1–4.

A. Krzesinski, "A Study of the Effect of Technological Parameters of RF sputtering on the Size of Grains and the Texture of Thin ZnO Films", Thin Solid Films, Apr. 1, 1986, Switzerland, vol. 138, No. 1, pp. 111–120.

F.C.M. Van De Pol, et al., "R.F. Planar Magnetron Sputtered ZnO Films. I. Structural Properties", Thin Solid Films, Oct. 10, 1991, Switzerland, vol. 204, No. 2, pp. 349–364.

T.F. Huang, et al., Growth And Effects of Single–crystalline ZnO Buffer Layer on GaN Epitaxy, 1998, pp. 11–14.

Patent Abstracts of Japan, Feb. 14, 1997.
Patent Abstracts of Japan, Oct. 13, 1995.
Patent Abstracts of Japan, Oct. 25, 1998.

F.C.M. Van de Pol, et al., R.F. Planar Magnetron Sputtered ZnO Films, 1991, pp. 349–364 and title page.

* cited by examiner

*Primary Examiner*—Eddie Lee
*Assistant Examiner*—Joseph Nguyen
(74) *Attorney, Agent, or Firm*—Keating & Bennett, LLP

(57) ABSTRACT

A semiconductor light emitting device includes:
a substrate; a ZnO buffer layer formed on the substrate; and a GaN-based light emitting layer formed on the ZnO buffer layer. The ZnO buffer layer has an average crystalline grain size of ZnO grains of about 0.45 $\mu$m or more, or 0.12 $\mu$m or less.

5 Claims, 3 Drawing Sheets

SEMICONDUCTOR LIGHT EMITTING DEVICE AND METHOD FOR ADJUSTING THE LUMINOUS INTENSITY THEREOF

BACKGROUND OF THE INVENTION

1. Field of the Invention

The present invention relates to a semiconductor light emitting device, particularly, a semiconductor light emitting device including GaN-based compound semiconductor such as GaN, InGaN, GaAlN and InGaAlN, and a method for adjusting the luminous intensity.

2. Description of the Related Art

As materials for semiconductor light emitting devices such as light emitting diodes (LED) and laser diodes (LD) which emit light in the range of the yellow color to the UV rays, particularly emit blue color light, group III–V compound semiconductors expressed by a general formula of $In_xGa_yAl_zN$ (where x+y+z=1, $0 \leq x \leq 1$, $0 \leq y \leq 1$, $0 \leq z \leq 1$) are known. As these compound semiconductors are of a direct transition type, the light emitting efficiency of these compound semiconductors are generally high. Further, the wavelength of the emitting light can be controlled with the In concentration. Thus, great attention has been paid to the compound semiconductors as a light emitting device material.

Generally, it is very difficult to grow a GaN-based bulk crystal. Therefore, for production of the crystal film, a so-called hetero-epitaxial growth method by which the GaN-based crystal film is grown on a substrate made of a different material is used.

Conventionally, as an underlying substrate for use in the hetero-epitaxial growth method of GaN, a C-plane sapphire substrate has been primarily used. In this case, first, on the C-plane sapphire substrate, a low temperature growth GaN layer and an AlN layer are formed as buffer layers. A crystal film of GaN is grown on these buffer layers. As a result, a GaN layer having a good crystallinity is formed.

However, even if these buffer layers are used, there are many crystal defects in the formed GaN layer due to the difference between the lattice constants of the C-plane sapphire substrate and GaN (the difference between the lattice constants being about 16.1%) Accordingly, crystal films having satisfactory crystallinities have not been obtained. For this reason, it is desired to form a GaN layer having an improved crystallinity. Further, since the C-plane sapphire substrate used as the underlying substrate is very expensive, a method of forming a GaN layer by use of an inexpensive underlying substrate is desired.

Recently, in order to satisfy the above requirements, a technique in which a ZnO film is used as the buffer layer on which the GaN layer is to be formed has been proposed. The c-axially oriented ZnO film has a lattice constant which is relatively equal to that of GaN (the difference between the lattice constants being about 2%). Accordingly, crystal defects caused by the difference between the lattice constants can be inhibited. In addition, as to the ZnO film, the c-axially oriented film can be relatively easily formed substantially on any substrate except some substrates such as the R-plane sapphire and so forth. Thus, when the ZnO film is used as the buffer layer, crystal defects of GaN, caused by the difference between the lattice constants, can be inhibited, and moreover, the underlying substrate on which the GaN layer is formed can be selected from a wide variety of substrates. That is, the GaN layer can be formed by use of a silicon substrate, a glass substrate, and so forth, which are relatively inexpensive, as the underlying substrate.

However, a method of using the c-axially oriented ZnO film as a buffer layer has not been practically used. This is because, heretofore, it has not been possible to form a GaN layer having a sufficient luminous intensity when a c-axially oriented ZnO film has been used as the buffer layer.

SUMMARY OF THE INVENTION

In view of the foregoing, the present invention is directed to a GaN-based semiconductor light emitting device having a sufficient luminous intensity and a method for adjusting the luminous intensity of a GaN-based semiconductor light emitting device.

The semiconductor light emitting device comprises a substrate, a ZnO buffer layer formed on the substrate and a GaN-based light emitting layer formed on the ZnO buffer layer, wherein the ZnO buffer layer has an average crystalline grain size of ZnO grains of about 0.45 $\mu$m or more or 0.12 $\mu$m or less.

The method of adjusting the luminous intensity of a GaN-based semiconductor light emitting device comprising a substrate, a ZnO buffer layer formed on the substrate, and a GaN type semiconductor light emitting layer formed on the ZnO buffer layer, comprises the step of adjusting the intensity of light output of the GaN-based semiconductor light emitting device by changing the average crystalline grain size of the ZnO buffer layer.

According to the present invention, by proper adjustment of the average crystalline grain size of the ZnO constituting the ZnO buffer layer, the GaN layer having a remarkably higher luminous intensity compared to a conventional one can be formed. More concretely, by formation of the ZnO grains of the ZnO buffer layer to have an average crystalline grain size of at least 0.45 $\mu$m or of up to 0.12 $\mu$m, a GaN layer having a sufficient luminous intensity can be produced. Thus, it is possible to realize a GaN-based light emitting device having a sufficiently great luminous intensity.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Figure 1:
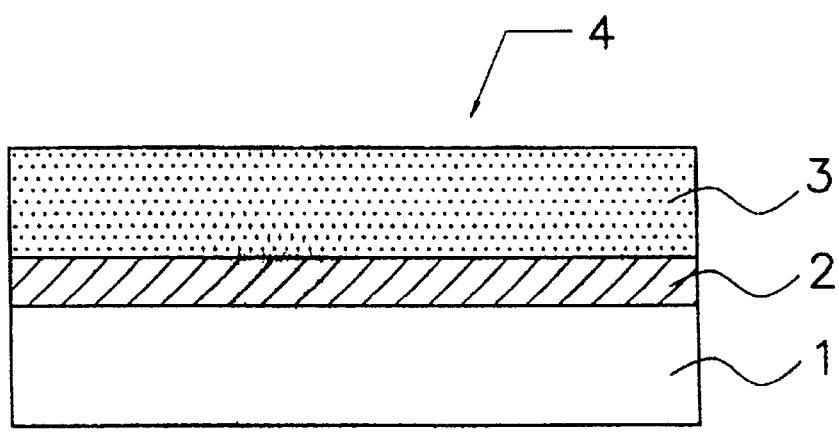
FIG. 1 is a cross sectional view of a semiconductor light emitting device according to an embodiment of the present invention.

In accordance with the present invention, a GaN layer having a sufficient luminous intensity is successfully formed by adjusting the average crystalline grain size of ZnO grains (crystalline grains) constituting a ZnO buffer layer. More specifically, by adjusting the average crystalline grain size of the ZnO grains of the ZnO buffer layer to be at least 0.45 $\mu$m or to be up to 0.12 $\mu$m, the GaN layer having a sufficient luminous intensity can be formed.

Conventionally, the film-formation of the ZnO buffer layer for use in the formation of the GaN layer has been carried out nearly under the same film-formation conditions as those for a ZnO film for other general uses, such as an SAW filter for a television tuner, and so forth. More particularly, the film-formation has been made under the film-formation conditions as shown in the following Table 1. As the result of analysis, it has been revealed that under the conventional film-formation conditions, the average crystalline grain size of the ZnO grains of a ZnO film to be formed is about 0.25μm (about ±0.05 μm).

TABLE 1

|  | Conventional example |
|---|---|
| Grain size of ZnO | 0.25 μm |
| Film thickness of ZnO buffer layer | 3 μm |
| Film-formation apparatus | RF magnetron sputtering system |
| Substrate temperature (° C.) | 230 |
| Gas pressure (Torr) | $1 \times 10^{-4}$ |
| Applied power | 350 W |

When the ZnO film is formed under the film-formation conditions described below to have an average crystalline grain size of the ZnO grains of the ZnO film of at least 0.45 μm or that of up to 0.12 μm, the luminous intensity of the GaN layer formed on the ZnO buffer layer can be remarkably enhanced as compared with a conventionally formed ZnO buffer. The causal relationship between the average crystalline grain size of the ZnO grains of the ZnO film and the luminous intensity of the GaN layer has not been completely determined. The following effect may participate in the casual relationship. That is, it is speculated that by forming the Zn grains to be large, namely to be at least 0.45 μm, the GaN grown on the ZnO grains has a large crystalline grain size, and by the. increase of the crystalline grain size of the GaN, the luminous intensity of the GaN is enhanced. On the other hand, it is speculated that by forming the ZnO grains to be small, namely, to be up to 0.12 μm, the individual GaN crystalline grains, although small, are present in a greatly packed state without voids. As a result, the non-crystallization regions between the crystal grains are greatly decreased, resulting in a higher luminous intensity of the GaN.

The term "crystalline grain size of ZnO grains" used in this invention means the diameters of individual c-axially oriented crystalline grains, viewed from the c-axial direction. The average value of crystalline grains may be obtained by different average-value calculating techniques. In accordance with one technique, several points of the ZnO buffer layer are randomly selected, the grain sizes of the ZnO grains contained at the selected points are measured, and the average values are calculated.

Hereinafter, an embodiment of the present invention will be described in more detail with reference to the drawings.

FIG. 1 is a cross sectional view of a semiconductor light emitting device according to an embodiment of the present invention. In FIG. 1, the reference numerals 1, 2, and 3 designate a silicon substrate as an underlying substrate, a ZnO buffer layer on which a GaN layer is to be formed, and a GaN layer which is a semiconductor light emitting layer, respectively. The ZnO grains (crystalline grains) constituting the ZnO buffer layer 2 are formed to have an average crystalline grain size of 0.45 μm or more; or an average crystalline grain size 0.12 μm or less. The average crystalline grain size of the ZnO grains can be desirably controlled by changing the film-formation conditions such as the type or power of the film-forming apparatus, a substrate temperature, a gas pressure and so forth. The semiconductor light emitting device 4 is a light emitting device which presents a luminous spectrum in the vicinity of the end of a band (365 nm) when an exciting energy such as a laser beam or the like is applied from the outside of device.

Hereinafter, the procedures for preparation of this semiconductor light emitting device 4 will be described.

First, as the underlying substrate on which the GaN Layer is formed, a silicon substrate 1 of 0.38 mm in thickness and 3 inch in diameter is prepared. On the silicon substrate 1, the different ZnO buffer layers 2 denoted by Samples A through G are formed in the respective film-formation conditions listed in the following Table 2. By adjusting the film-formation conditions as described above, the ZnO buffer layers 2 denoted by Samples A through G, having different grain sizes can be formed.

TABLE 2

| Sample | A | B | C | D | E | F | G |
|---|---|---|---|---|---|---|---|
| Grain size of ZnO (μm) | 0.05 | 0.12 | 0.18 | 0.25 | 0.35 | 0.45 | 0.65 |
| Film thickness of ZnO buffer layer (μm) | 3 | 3 | 3 | 3 | 3 | 3 | 3 |
| Film-formation apparatus* | ECR | ECR | RF | RF | RF | RF | RF |
| Substrate temperature (° C.) | 230 | 250 | 200 | 230 | 230 | 250 | 300 |
| Gas pressure (Torr) | $5.0 \times 10^{-4}$ | $5.0 \times 10^{-4}$ | $1.0 \times 10^{-2}$ | $1.0 \times 10^{-2}$ | $1.1 \times 10^{-2}$ | $1.2 \times 10^{-2}$ | $1.3 \times 10^{-2}$ |
| Applied power (W) | 350 | 350 | 350 | 350 | 350 | 350 | 350 |

*Note
"ECR" represents an ECR sputtering apparatus.
"RF" represents an RF magnetron sputtering apparatus.

Subsequently, on the respective ZnO buffer layers A through G formed under the above film-formation conditions, GaN layers as light emitting layers are formed by means of an ECR-MBE apparatus, so that the semiconductor light emitting devices 4 having the film-structures as shown in FIG. 1 are obtained. A method of forming a GaN layer with an ECR-MBE apparatus, which may be used to form the GaN layer 3, is disclosed in U.S. patent application Ser. No. 09/201,924 or German Patent Publication 19855476.1-33 by the inventors of the present application, the respective disclosures of which are hereby incorporated by reference.

Figure 2A:
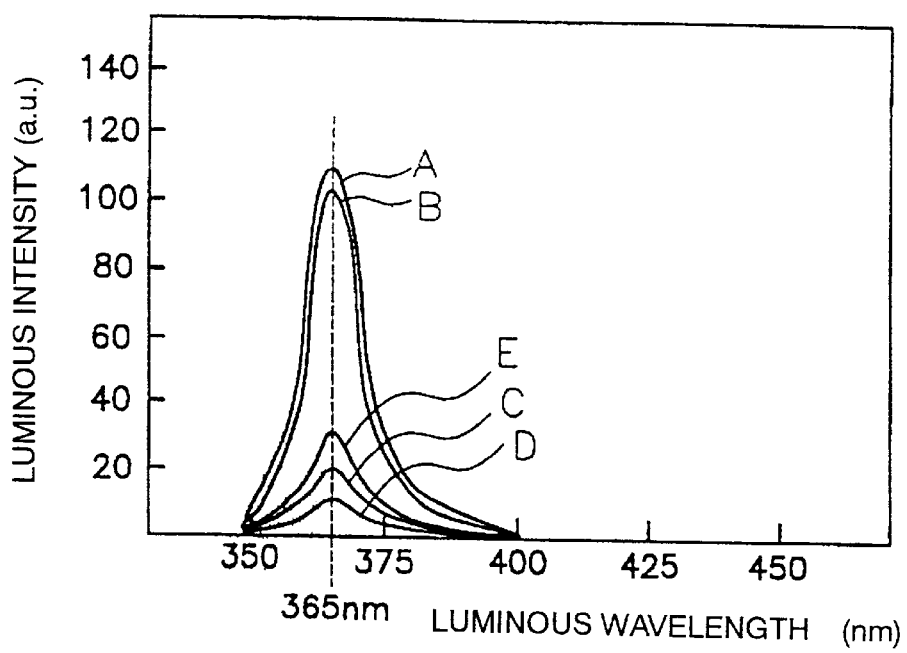
FIGS. 2A and 2B are graphs showing the measurement results of the photo luminescence spectra of the devices which have GaN layers formed on ZnO having different grain sizes.
Figure 2B:
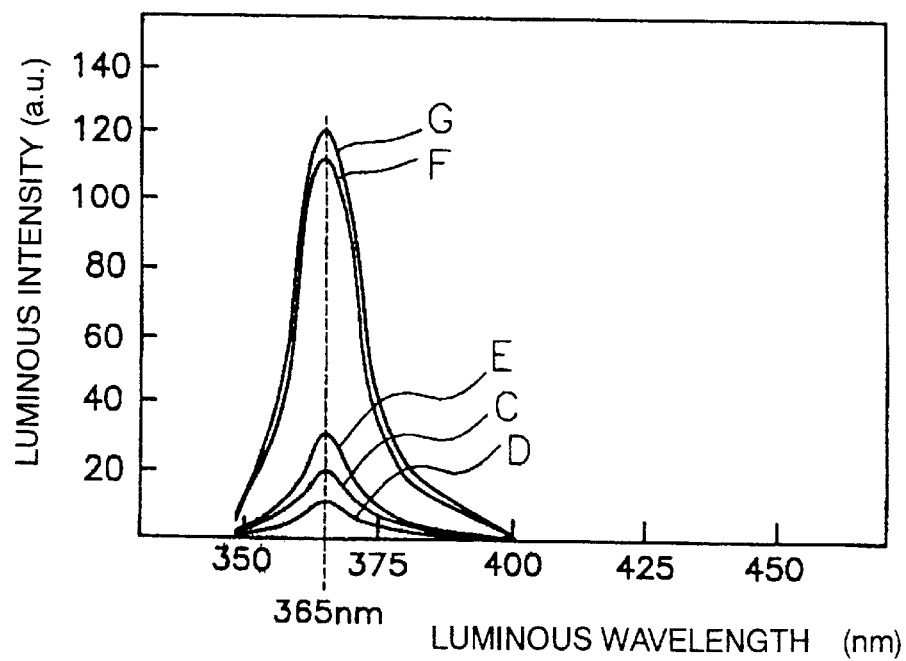

Finally, the optical properties of the respective light emitting devices containing the ZnO buffer layers A through G prepared by the above procedures will be examined. For the evaluation of the optical properties, the measurement of photo luminescence spectra obtained by use of a He—Cd laser as an exciting light source is carried out in a room temperature environment. The measurement results are shown in FIGS. 2A and 2B. In FIGS. 2A and 2B, the luminous wavelength λ is plotted as abscissa, and the output intensity is plotted as ordinate. The measurement results are separately shown in FIGS. 2A and 2B to be shown clearly.

As seen in FIGS. 2A and 2B, the devices A and B in which the ZnO grain sizes of the ZnO buffer layers are up to 0.12 $\mu$m, and the devices F and G in which the ZnO grain sizes are at least 0.45 $\mu$m have a remarkably higher luminous intensities as compared with the devices C,D, and E.

Figure 3:
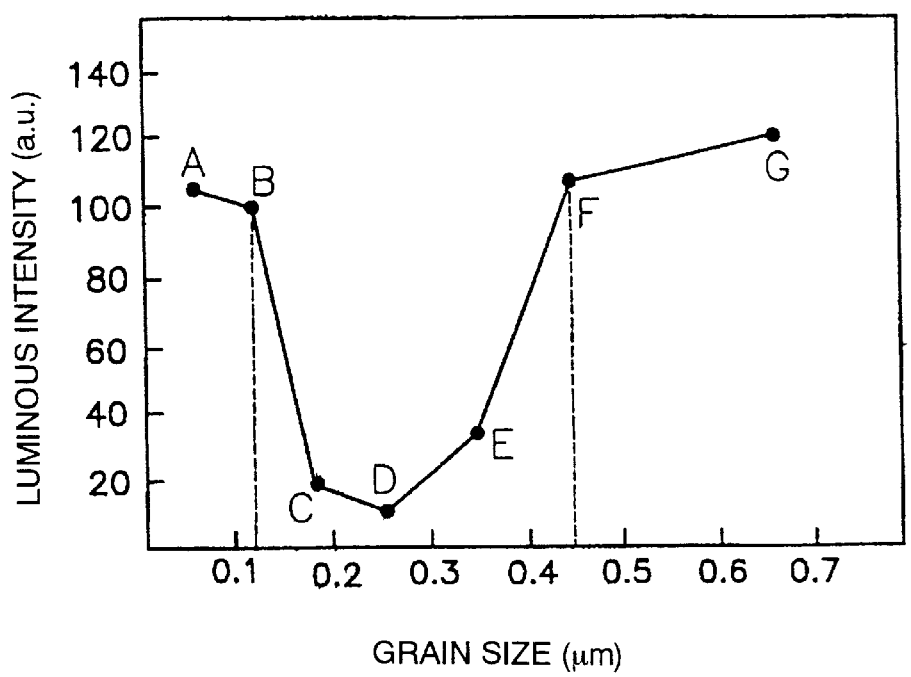
FIG. 3 is a graph showing the relationship between the intensity of light output at 365 nm and the grain size of ZnO film.

FIG. 3 is a graph showing the relationship between the intensity of light output at 365 nm and the grain size of ZnO film plotted by using the measurement results on Samples A to G. As seen in this graph, when the ZnO grains are formed to have a size of 0.45 $\mu$m or more or to have a size of 0.12 $\mu$m or less, the semiconductor light emitting devices having a higher luminous intensity than the conventional devices can be obtained. When the luminous intensity of the light emitting device needs to be adjusted for a particular use, the ZnO grain size may be appropriately selected referring to the graph shown in FIG. 3.

The present invention is not limited to the above-described embodiments, and other different modifications can be made.

For example, in this embodiment, as the underlying substrate, a silicon substrate is used. However, other substrates may be used instead. More particularly, as described in the Description of the Related Art, when the ZnO film is used as the buffer layer, the c-axially oriented film can be easily formed substantially on any substrate.

Further, in this embodiment, the GaN layer is formed by means of the ECR-MBE apparatus. However, the GaN layer may be formed by other techniques. For example, an RF-MBE apparatus may be used. An MOCVD apparatus may also be used to form the GaN layer.

Further, in this embodiment, only two layers, that is, the ZnO buffer layer and the GaN layer, are formed on the silicon substrate. However, the invention is not restricted to this lamination structure. For example, another $SiO_2$ film may be interposed between the silicon substrate and the ZnO buffer layer. Further, the GaN layer may have a heterostructure.

The present invention is characterized in that the luminous intensity of the GaN layer is controlled by adjustment of the ZnO grain size of the ZnO buffer layer, and, more specifically, is characterized in that a semiconductor light emitting device having a remarkably luminous intensity as compared to a conventional one is achieved by adjusting the ZnO grain size to be at least 0.45 $\mu$m or up to 0.12 $\mu$m. The type of the underlying substrate and the film-formation method for the GaN layer are not indispensable characteristics.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A semiconductor light emitting device comprising:
   a substrate;
   a ZnO buffer layer formed on the substrate; and
   a GaN-based light emitting layer formed on the ZnO buffer layer;
   wherein the ZnO buffer layer has a crystalline grain size of ZnO grains of 0.45 $\mu$m or more.

2. A semiconductor light emitting device according to claim 1, wherein the substrate is made of silicon.

3. A semiconductor light emitting device according to claim 1, wherein the ZnO layer is a c-oriented ZnO layer.

4. A method for adjusting the luminous intensity of a GaN-based semiconductor light emitting device comprising a substrate, a ZnO buffer layer formed on the substrate, and a GaN type semiconductor light emitting layer formed on the ZnO buffer layer, the method comprising the step of adjusting the luminous intensity of the GaN-based semiconductor light emitting device by changing the crystalline grain size of the ZnO buffer layer, wherein the crystalline grain size is adjusted to 0.45 $\mu$m or more.

5. The method according to claim 4, wherein the GaN layer is formed with an ECR-MBE apparatus.

* * * * *